US011563490B2

(12) United States Patent
Tsukagoshi

(10) Patent No.: US 11,563,490 B2
(45) Date of Patent: *Jan. 24, 2023

(54) TRANSMISSION APPARATUS, TRANSMISSION METHOD, RECEPTION APPARATUS, AND RECEPTION METHOD

(71) Applicant: SONY CORPORATION, Tokyo (JP)

(72) Inventor: Ikuo Tsukagoshi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/135,685

(22) Filed: Dec. 28, 2020

(65) Prior Publication Data

US 2021/0119701 A1    Apr. 22, 2021

Related U.S. Application Data

(63) Continuation of application No. 15/510,876, filed as application No. PCT/JP2015/080541 on Oct. 29, 2015, now Pat. No. 10,924,184.

(30) Foreign Application Priority Data

Nov. 7, 2014  (JP) .................................. 2014-227297

(51) Int. Cl.
*H04N 21/236*    (2011.01)
*H04N 21/25*    (2011.01)
(Continued)

(52) U.S. Cl.
CPC ............. *H04B 10/25* (2013.01); *G02B 6/422* (2013.01); *G02B 6/4214* (2013.01);
(Continued)

(58) Field of Classification Search
None
See application file for complete search history.

(56) References Cited

U.S. PATENT DOCUMENTS 9,706,184 B2 * 7/2017 Uchimura ............ G11B 27/329
9,736,507 B2 * 8/2017 Oh ...................... H04N 21/2362
(Continued)

FOREIGN PATENT DOCUMENTS

KR       20120089391 A    8/2012
WO    WO-2010021694 A1    2/2010
(Continued)

OTHER PUBLICATIONS

T. Borer, "Non-linear Opto-Electrical Transfer Functions for High Dynamic Range Television," Research & Development White Paper WHP 283, BBC, Jul. 2014. 23 pages.
(Continued)

*Primary Examiner* — Mushfikh I Alam
(74) *Attorney, Agent, or Firm* — Oblon, McClelland, Maier & Neustadt, L.L.P.

(57) ABSTRACT

Both a conventional receiver and an HDR-compatible receiver well perform electro-optical conversion processing on transmission video data obtained by using an HDR opto-electronic transfer characteristic. High dynamic range opto-electronic conversion is performed on high dynamic range video data to obtain the transmission video data. Encoding processing is performed on this transmission video data to obtain a video stream. A container of a predetermined format including this video stream is transmitted. Metadata information indicating a standard dynamic range opto-electronic transfer characteristic is inserted into a layer of the video stream, and metadata information indicating a high dynamic range opto-electronic transfer characteristic is inserted into at least one of the layer of the video stream and a layer of the container.

16 Claims, 15 Drawing Sheets

(51) Int. Cl.
| | |
|---|---|
| *H04B 10/25* | (2013.01) |
| *H04N 5/225* | (2006.01) |
| *H04N 5/20* | (2006.01) |
| *H04N 21/235* | (2011.01) |
| *H04N 21/435* | (2011.01) |
| *H01S 5/02251* | (2021.01) |
| *G02B 6/42* | (2006.01) |
| *H04B 10/272* | (2013.01) |

(52) U.S. Cl.
CPC ......... *G02B 6/4246* (2013.01); *G02B 6/4292* (2013.01); *H01S 5/02251* (2021.01); *H04B 10/2725* (2013.01); *H04N 5/20* (2013.01); *H04N 5/225* (2013.01); *H04N 21/235* (2013.01); *H04N 21/23614* (2013.01); *H04N 21/4358* (2013.01)

(56) References Cited

U.S. PATENT DOCUMENTS

| | | | |
|---|---|---|---|
| 9,854,333 B2 | 12/2017 | Hwang et al. | |
| 9,973,779 B2* | 5/2018 | Konstantinides | H04N 19/85 |
| 2010/0166067 A1* | 7/2010 | Park | H04N 19/186 |
| | | | 375/240.12 |
| 2010/0232508 A1 | 9/2010 | Kang et al. | |
| 2013/0103849 A1* | 4/2013 | Mao | H04N 21/6332 |
| | | | 709/231 |
| 2013/0148029 A1* | 6/2013 | Gish | G09G 5/02 |
| | | | 348/708 |
| 2014/0165093 A1 | 6/2014 | Redol | |
| 2014/0210847 A1 | 7/2014 | Knibbeler et al. | |
| 2014/0225941 A1 | 8/2014 | Van der Vleuten et al. | |
| 2014/0341272 A1 | 11/2014 | Miller et al. | |
| 2015/0016540 A1* | 1/2015 | Rapaka | H04N 19/176 |
| | | | 375/240.24 |
| 2015/0178904 A1* | 6/2015 | Boitard | G06T 5/007 |
| | | | 382/274 |
| 2015/0312584 A1* | 10/2015 | Boyce | H04N 19/46 |
| | | | 375/240.16 |
| 2016/0073118 A1 | 3/2016 | Iguchi et al. | |
| 2016/0100147 A1* | 4/2016 | Kim | H04N 5/20 |
| | | | 386/242 |
| 2016/0134832 A1 | 5/2016 | Yamamoto et al. | |
| 2016/0173811 A1* | 6/2016 | Oh | H04N 7/015 |
| | | | 725/116 |
| 2016/0345023 A1 | 11/2016 | Tsukagoshi | |
| 2016/0345032 A1 | 11/2016 | Tsukagoshi | |
| 2016/0373712 A1* | 12/2016 | Yamamoto | H04N 9/8205 |
| 2017/0019678 A1* | 1/2017 | Kim | H04N 19/186 |
| 2017/0249950 A1* | 8/2017 | Hoerich | G10L 19/167 |
| 2018/0191997 A1* | 7/2018 | Oh | H04N 21/2353 |
| 2018/0295318 A1 | 10/2018 | Tsukagoshi | |
| 2019/0281325 A1 | 9/2019 | Song et al. | |
| 2020/0154143 A1 | 5/2020 | Tsukagoshi | |

FOREIGN PATENT DOCUMENTS

| | | |
|---|---|---|
| WO | WO-2010021722 A1 | 2/2010 |
| WO | 2013/039730 A2 | 3/2013 |
| WO | 2013/046095 A1 | 4/2013 |
| WO | 2014/178286 A1 | 11/2014 |

OTHER PUBLICATIONS

International Search Report dated Jan. 26, 2016 in PCT/JP2015/080541 filed Oct. 29, 2015.
Extended European Search Report dated May 16, 2018 in corresponding European Patent Application No. 15857423.6, 10 pages.
Office Action dated Jun. 18, 2019 in Chinese Patent Application No. 201580058817.7, with English translation.
Office Action dated Jul. 23, 2019 in Japanese Patent Application No. 2016-557734 (with English translation).
Oral Proceedings Summons dated Jan. 29, 2020 in European Application No. 15857423.6.
"ITU-T High Efficiency video coding H.265 (Oct. 2014)—Annex E Video usability information", Oct. 29, 2014, XP055658077, 21 pages.
Sally Hattori et al., "HLS: SEI Message for Knee Function Information", 16$^{th}$ JCT-VC Meeting; Jan. 9-17, 2014;San Jose; (Joint Collaborative Team On Video Coding of ISO/IEC JTC1/SC29/WG11 and ITU TSG.16), No. JCTVC-P0050, XP030115513, Dec. 31, 2013, 21 page URL:http://wftp3.itu.int/av-arch/jctvc-si te/.

* cited by examiner

FIG. 6

Dynamic Range SEI

| Syntax | No. of Bits | Format |
|---|---|---|
| Dynamic Range SEI (){ | | |
| transfer_characteristics2 | 8 | uimsbf |
| number_of_bits | 8 | uimsbf |
| minimum_brightness_value | 16 | uimsbf |
| peak_level | 16 | uimsbf |
| peak_level_brightness | 16 | uimsbf |
| compliant_threshold_level | 16 | uimsbf |
| compliant_threshold_level_value | 16 | uimsbf |
| } | | |

FIG. 7 semantics

| | |
|---|---|
| transfer_characteristics2 (8bits) | REPRESENTS opto-electronic TRANSFER CHARACTERISTIC OF VIDEO MATERIAL. EOTF (INVERSE OETF CHARACTERISTIC) FOR DISPLAY IS DETECTED. DESIGNATES HDR TRANSFER CHARACTERISTIC. |
| number_of_bits (8bits) | NUMBER OF BITS OF ENCODED PIXEL. |
| minimum_brightness_value (16bits) | MINIMUM LEVEL BRIGHTNESS (cd/m²) |
| peak_level (16 bits) | MAXIMUM LEVEL RELATIVE VALUE (%) |
| peak_level_brightness (16bits) | MAXIMUM LEVEL BRIGHTNESS (cd/m²) |
| compliant_threshold_level (16bits) | THRESHOLD AT TIME OF DISPLAY LEVEL MAPPING (%) |
| compliant_threshold_level_value (16bits) | BRIGHTNESS THAT SERVES AS THRESHOLD AT TIME OF DISPLAY LEVEL MAPPING (cd/m²) |

FIG. 8

Video Dynamic Range descriptor

| Syntax | No. of Bits | Format |
|---|---|---|
| Video Dynamic Range descriptor(){ | | |
| descriptor_tag | 8 | uimsbf |
| descriptor_length | 8 | uimsbf |
| transfer_characteristics2 | 8 | uimsbf |
| number_of_bits | 8 | uimsbf |
| minimum_brightness_value | 16 | uimsbf |
| peak_level | 16 | uimsbf |
| peak_level_brightness | 16 | uimsbf |
| compliant_threshold_level | 16 | uimsbf |
| compliant_threshold_level_value | 16 | uimsbf |
| } | | |

FIG. 14

HDMI Vendor Specific InfoFrame (FOR SDR)

| Packet Byte # | 7 | 6 | 5 | 4 | 3 | 2 | 1 | 0 |
|---|---|---|---|---|---|---|---|---|
| ... | | | | | | | | |
| PB7 | Display_control_type (3bits) | | | Display_control_metadata_length = 2 | | | | |
| PB8 | Transfer characteristics (8bits) | | | | | | | |
| PB8+1 | Number of bits (8bits) | | | | | | | |

FIG. 15

HDMI Vendor Specific InfoFrame (FOR HDR)

| Packet Byte # | 7 | 6 | 5 | 4 | 3 | 2 | 1 | 0 |
|---|---|---|---|---|---|---|---|---|
| ... | | | | | | | | |
| PB7 | Display_control_type (3bits) | | | ... | | | | |
| PB8 | Display_control_metadata_length = 12 | | | | | | | |
| PB8+1 | Transfer characteristics (8bits) | | | | | | | |
| PB8+2 | Number of bits (8bits) | | | | | | | |
| PB8+3 | Minimum brightness value MSB (8bits) | | | | | | | |
| PB8+4 | Minimum brightness value LSB (8bits) | | | | | | | |
| PB8+5 | Peak Level MSB (8bits) | | | | | | | |
| PB8+6 | Peak Level LSB (8bits) | | | | | | | |
| PB8+7 | Peak Level Brightness MSB (8bits) | | | | | | | |
| PB8+8 | Peak Level Brightness LSB (8bits) | | | | | | | |
| PB8+9 | Compliant_threshold_level MSB (8bits) | | | | | | | |
| PB8+10 | Compliant_threshold_level LSB (8bits) | | | | | | | |
| PB8+11 | Compliant_threshold_level Value MSB (8bits) | | | | | | | |
| PB8+12 | Compliant_threshold_level Value LSB (8bits) | | | | | | | |

FIG. 16

HDMI VS Info          Display Control semantics

Display_control_type (3bits)    REPRESENTS KIND OF DISPLAY TYPE.
  "001" REPRESENTS SDR DISPLAY CONTROL.
  "010" REPRESENTS HDR DISPLAY CONTROL.

Display_control_metadata_length (5bits)    REPRESENTS SIZE OF Display_control_metadata.

transfer_characteristics (8bits)    opto-electronic TRANSFER CHARACTERISTIC OF VIDEO MATERIAL.
                                    EOTF (INVERSE OETF CHARACTERISTIC) FOR DISPLAY IS DETECTED.
  0x01    SDR TRANSFER CHARACTERISTIC (e.g. GAMMA)
  0x10    HDR TRANSFER CHARACTERISTIC (e.g. NEW GAMMA)

number_of_bits (8bits)    NUMBER OF BITS OF ENCODED PIXEL.

minimum_brightness_value (16bits)    MINIMUM LEVEL BRIGHTNESS (cd/m²)

peak_level (16 bits)    MAXIMUM LEVEL RELATIVE VALUE (%)

peak_level_brightness (16bits)    MAXIMUM LEVEL BRIGHTNESS (cd/m²)

compliant_threshold_level (16bits)    THRESHOLD AT TIME OF DISPLAY LEVEL MAPPING (%)

compliant_threshold_level_value (16bits)    BRIGHTNESS THAT SERVES AS THRESHOLD AT TIME OF DISPLAY LEVEL MAPPING (cd/m²)

TRANSMISSION APPARATUS, TRANSMISSION METHOD, RECEPTION APPARATUS, AND RECEPTION METHOD

CROSS-REFERENCE TO RELATED APPLICATIONS

This application is a continuation of U.S. application Ser. No. 15/510,876 filed Mar. 13, 2017, which is a National Stage Application of PCT Application No. PCT/JP2015/080541, filed Oct. 29, 2015, and claims priority of Japanese patent application 2014-227297 filed Nov. 7, 2014 the entire contents of all of which are incorporated herein by reference.

TECHNICAL FIELD

The present technology relates to a transmission apparatus, a transmission method, reception apparatus, and a reception method, and in particular to a transmission apparatus or the like that transmits transmission video data obtained by applying high dynamic range opto-electronic conversion to high dynamic range video data.

BACKGROUND ART

Conventionally, it is considered to transmit transmission video data obtained by applying high dynamic range opto-electronic conversion to high dynamic range video data. Hereinafter, the high dynamic range is referred to as "HDR" as appropriate. For example Non-Patent Document 1 describes an HDR opto-electronic transfer characteristic (new gamma characteristic) including a region compatible with a conventional opto-electronic transfer characteristic (gamma characteristic) considering reception by a conventional receiver.

CITATION LIST

Non-Patent Document

Non-Patent Document 1: Tim Borer, "Non-Linear Opto-Electrical Transfer Functions for High Dynamic Range Television", Research & Development White Paper WHP 283, July 2014.

SUMMARY OF THE INVENTION

Problems to be Solved by the Invention

For example, when transmitting transmission video data obtained by using the above-described HDR opto-electronic transfer characteristic including the region compatible with the conventional opto-electronic transfer characteristic, it is necessary that the conventional receiver should be able to determine that the opto-electronic transfer characteristic is similar to conventional one, and that an HDR-compatible receiver should be able to determine that the opto-electronic transfer characteristic is the HDR opto-electronic transfer characteristic.

An object of the present technology is to enable both the conventional receiver and the HDR-compatible receiver to well perform electro-optical conversion processing on the transmission video data obtained by using the HDR opto-electronic transfer characteristic.

Solutions to Problems

A concept of the present technology lies in
a transmission apparatus including:
an opto-electronic conversion unit configured to perform high dynamic range opto-electronic conversion on high dynamic range video data to obtain transmission video data;
pan encoding unit configured to perform encoding processing on the transmission video data to obtain video stream;
a transmission unit configured to transmit a container of a predetermined format including the video stream; and
an information insertion unit configured to insert metadata information indicating a standard dynamic range opto-electronic transfer characteristic into a layer of the video stream, and to insert metadata information indicating the high dynamic range opto-electronic transfer characteristic into at least one of the layer of the video stream and a layer of the container.

In the present technology, the opto-electronic conversion unit performs high dynamic range opto-electronic conversion on the high dynamic range video data to obtain the transmission video data. In this case, for example, a high dynamic range opto-electronic transfer characteristic (new gamma characteristic) including a region compatible with the conventional opto-electronic transfer characteristic (gamma characteristic) may be used.

The encoding unit performs encoding processing on the transmission video data to obtain the video stream. The transmission unit transmits the container of a predetermined format including this video stream. For example, the container may be a transport stream (MPEG-2 TS) employed by digital broadcasting standards. In addition, for example, the container may be a container in a format of MP4 used for distribution on the Internet or the like, or a container in a format other than MP4.

The information insertion unit inserts the metadata information indicating the standard dynamic range opto-electronic transfer characteristic into the layer of the video stream, and inserts the metadata information indicating the high dynamic range opto-electronic transfer characteristic into at least one of the layer of the video stream and the layer of the container.

For example, when inserting the metadata information indicating the high dynamic range opto-electronic transfer characteristic into the layer of the video stream, the information insertion unit may insert the metadata information indicating the standard dynamic range opto-electronic transfer characteristic into a first region in the video stream, and insert the metadata information indicating the high dynamic range opto-electronic transfer characteristic into a second region different from the first region in the video stream. In this case, for example, the first region may be a region of an SPS NAL unit, and the second region may be a region of an SEI NAL unit.

In addition, for example, the container may be a transport stream, and when inserting the metadata information indicating the high dynamic range opto-electronic transfer characteristic into the layer of the container, the information insertion unit may insert this metadata information under a program map table. In addition, for example, the container may be a transport stream, and when inserting the metadata information indicating the high dynamic range opto-electronic transfer characteristic into the layer of the container, the information insertion unit may insert this metadata information under an event information table.

In this way, in the present technology, the metadata information indicating the standard dynamic range opto-electronic transfer characteristic is inserted into the layer of the video stream, and the metadata information indicating the high dynamic range opto-electronic transfer characteristic is inserted into at least one of the layer of the video stream and the layer of the container.

Accordingly, both of a conventional receiver and an HDR-compatible receiver can well perform electro-optical conversion processing on the transmission video data obtained by using an HDR opto-electronic transfer characteristic. That is, the conventional receiver can determine that the opto-electronic transfer characteristic is similar to conventional one on the basis of the metadata information indicating the standard dynamic range opto-electronic transfer characteristic. In addition, the HDR-compatible receiver can determine that the opto-electronic transfer characteristic is the HDR opto-electronic transfer characteristic on the basis of the metadata information indicating the high dynamic range opto-electronic transfer characteristic.

In addition, in the present technology, for example, the information insertion unit may insert metadata information for display control together with the metadata information indicating the high dynamic range opto-electronic transfer characteristic. In this case, for example, the metadata information for display control may include peak brightness information. In addition, for example, the metadata information for display control may include region information indicating a region in which brightness conversion is permitted. In this case, the HDR-compatible receiver can perform display brightness control appropriately by using this metadata information for display control.

In addition, another concept of the present technology lies in a reception apparatus including:

a reception unit configured to receive a container including a video stream obtained through encoding of transmission video data;

a decoding unit configured to perform decoding processing on the video stream to obtain the transmission video data; and an electro-optical conversion unit configured to perform electro-optical conversion on the transmission video data to obtain video data for display, wherein when metadata information indicating a standard dynamic range opto-electronic transfer characteristic is inserted into a layer of the video stream and metadata information indicating the high dynamic range opto-electronic transfer characteristic is inserted into at least one of the layer of the video stream and a layer of the container, on the basis of the metadata information indicating the high dynamic range opto-electronic transfer characteristic, the electro-optical conversion unit performs high dynamic range electro-optical conversion with a characteristic opposite to the high dynamic range opto-electronic transfer characteristic on the transmission video data to obtain the video data for display.

In the present technology, the reception unit receives the container including the video stream obtained through encoding of the transmission video data. The decoding unit performs decoding processing on the video stream to obtain the transmission video data. Then, the electro-optical conversion unit performs electro-optical conversion on the transmission video data to obtain the video data for display.

When the metadata information indicating the standard dynamic range opto-electronic transfer characteristic is inserted into the layer of the video stream and the metadata information is inserted into at least one of the layer of the video stream and the layer of the container. On the basis of this metadata information indicating the high dynamic range opto-electronic transfer characteristic, the electro-optical conversion unit performs high dynamic range electro-optical conversion with a characteristic opposite to this high dynamic range opto-electronic transfer characteristic on the transmission video data to obtain the video data for display.

In this way, the present technology enables the high dynamic range electro-optical conversion to be appropriately performed on the transmission video data obtained using the high dynamic range opto-electronic transfer characteristic to obtain the high dynamic range video data that is good as video data for display.

Note that the present technology may further include, for example, a brightness adjustment unit configured to perform display brightness adjustment on the video data for display. When the metadata information for display control is inserted together with the metadata information indicating the high dynamic range opto-electronic transfer characteristic, the brightness adjustment unit may perform display brightness adjustment on the video data for display on the basis of this metadata information for display control. In this case, for example, the metadata information for display control may include region information indicating a region in which brightness conversion is permitted, and the brightness adjustment unit may perform the display brightness adjustment in the region in which brightness conversion is permitted. In this case, the display brightness adjustment can be performed appropriately.

Effects of the Invention

The present technology enables both the conventional receiver and the HDR-compatible receiver to well perform electro-optical conversion processing on the transmission video data obtained by using the HDR opto-electronic transfer characteristic. It is to be noted that the effect described in the present specification is only illustrative and not restrictive, and may have additional effects.

BRIEF DESCRIPTION OF DRAWINGS

FIG. 6 is a diagram illustrating a structural example of a dynamic range SEI message.

FIG. 7 is a diagram illustrating content of major information in the structural example of the dynamic range SEI message.

FIG. 8 is a diagram illustrating a structural example of a video dynamic range descriptor.

FIG. 12 is a diagram for describing an SDR electro-optical transfer characteristic, SDR display mapping processing, an HDR electro-optical transfer characteristic, HDR display mapping processing, and the like.

FIG. 14 is a diagram illustrating a structural example of seventh and subsequent bytes of a packet of "Vender Specific InfoFrame" to be sent from a set top box to a monitor when compatible with SDR.

FIG. 15 is a diagram illustrating a structural example of the seventh and subsequent bytes of the packet of "Vender Specific InfoFrame" to be sent from the set top box to the monitor when compatible with HDR.

FIG. 16 is a diagram illustrating content of major information in each structural example of the packet of "Vender Specific InfoFrame."

MODE FOR CARRYING OUT THE INVENTION

Figure 1:
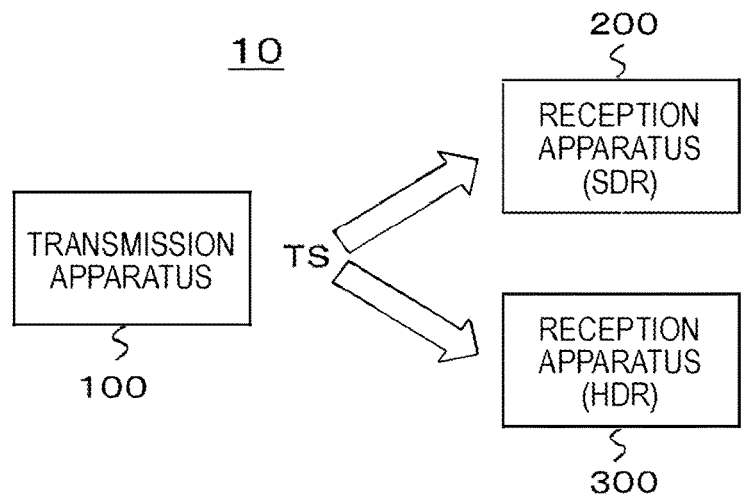
FIG. 1 is a block diagram illustrating a configuration example of a transmission and reception system as an embodiment.

Hereinafter, a mode for carrying out the invention (hereinafter referred to as "embodiment") will be described. Note that the description will be provided in the following order.
1. Embodiment
2. Variations 1. Embodiment Configuration Example of Transmission and Reception System FIG. 1 illustrates a configuration example of a transmission and reception system 10 as an embodiment. This transmission and reception system 10 includes a transmission apparatus 100 and reception apparatuses 200, 300. The reception apparatus 200 is a reception apparatus that is compatible with a conventional standard dynamic range (SDR) and that is not compatible with a high dynamic range (HDR). The reception apparatus 300 is an HDR-compatible reception apparatus.

The transmission apparatus 100 generates a transport stream TS of MPEG 2 as a container, and places this transport stream TS on a broadcast wave or a network packet and transmits the transport stream TS. This transport stream TS includes a video stream obtained by performing encoding processing on transmission video data obtained by performing HDR opto-electronic conversion on HDR video data.

Metadata information indicating an SDR opto-electronic transfer characteristic (gamma characteristic) is inserted into a layer of the video stream. In addition, metadata information indicating an HDR opto-electronic transfer characteristic (new gamma characteristic) is inserted into at least one of a layer of the video stream and a layer of the container. In addition, in this embodiment, together with this metadata information indicating the HDR opto-electronic transfer characteristic, metadata information for display control is inserted. This metadata information for display control includes peak brightness information and region information indicating a region in which brightness conversion is permitted.

The reception apparatus 200 performs decoding processing on the video stream included in the received container to obtain the transmission video data. The reception apparatus 200 can determine that the opto-electronic transfer characteristic is similar to conventional one on the basis of the metadata information indicating the SDR opto-electronic transfer characteristic inserted into the video stream. The reception apparatus 200 performs SDR electro-optical conversion with a characteristic opposite to the SDR opto-electronic transfer characteristic on the transmission video data to obtain video data for display. In addition, the reception apparatus 200 performs display mapping processing, that is, display brightness adjustment, on the video data for display, on the basis of peak brightness (100 cd/m$^2$), display maximum brightness of a monitor, and the like.

The reception apparatus 300 performs decoding processing on the video stream included in the received container to obtain the transmission video data. The reception apparatus 300 can determine that the opto-electronic transfer characteristic is the HDR opto-electronic transfer characteristic on the basis of the metadata information indicating the HDR opto-electronic transfer characteristic inserted into at least one of the layer of the video stream and the layer of the container. The reception apparatus 300 performs the HDR electro-optical conversion with a characteristic opposite to the HDR opto-electronic transfer characteristic on the transmission video data to obtain the video data for display. In addition, the reception apparatus 300 performs the display mapping processing, that is, the display brightness adjustment, on the video data for display on the basis of the metadata information for display control inserted together with the metadata information indicating the HDR opto-electronic transfer characteristic.

Configuration Example of Transmission Apparatus

Figure 2:
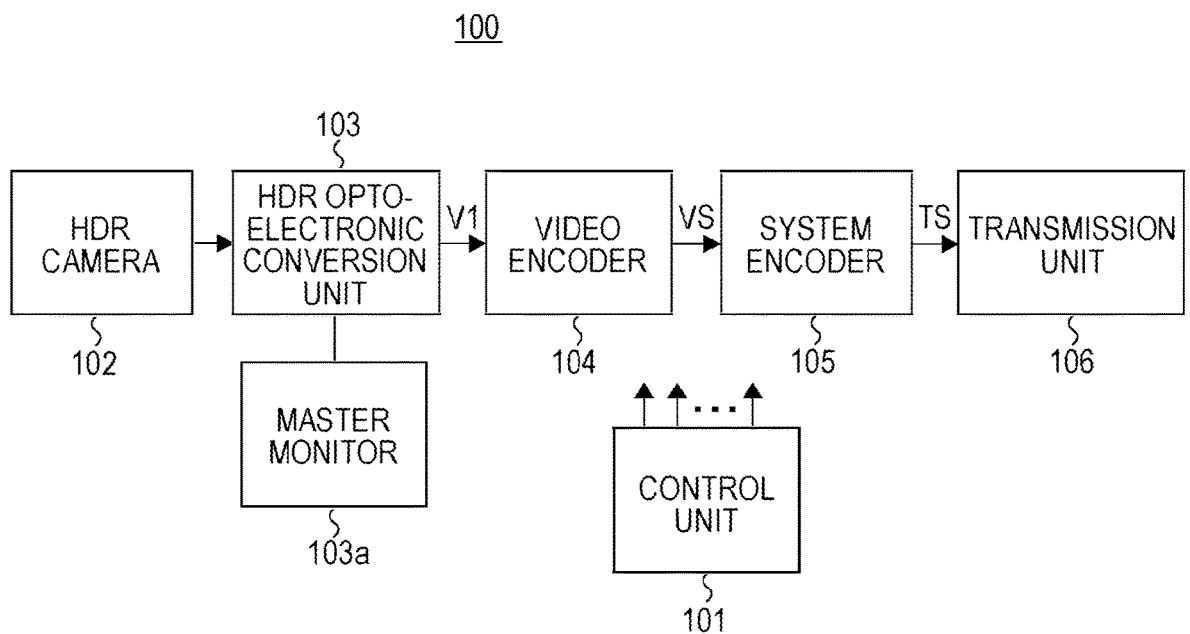
FIG. 2 is a block diagram illustrating a configuration example of a transmission apparatus that constitutes the transmission and reception system.

FIG. 2 illustrates a configuration example of the transmission apparatus 100. This transmission apparatus 100 includes a control unit 101, an HDR camera 102, an HDR opto-electronic conversion unit 103, a video encoder 104, a system encoder 105, and a transmission unit 106. The control unit 101 includes a central processing unit (CPU), and controls an operation of each unit of the transmission apparatus 100 on the basis of a control program.

The HDR camera 102 captures a subject and outputs high dynamic range (HDR) video data. This HDR video data has a contrast ratio of 0 to 100%×N (N is a number larger than 1) exceeding brightness of a white peak of a conventional SDR image, for example, 0 to 1000%. Here, a level of 100% corresponds to, for example, a brightness value of white, 100 cd/m$^2$.

A master monitor 103a is a monitor for performing grading on the HDR video data obtained by the HDR camera 102. This master monitor 103a has a display brightness level that is compatible with the HDR video data or that is suitable for performing grading on the HDR video data.

Figure 3:
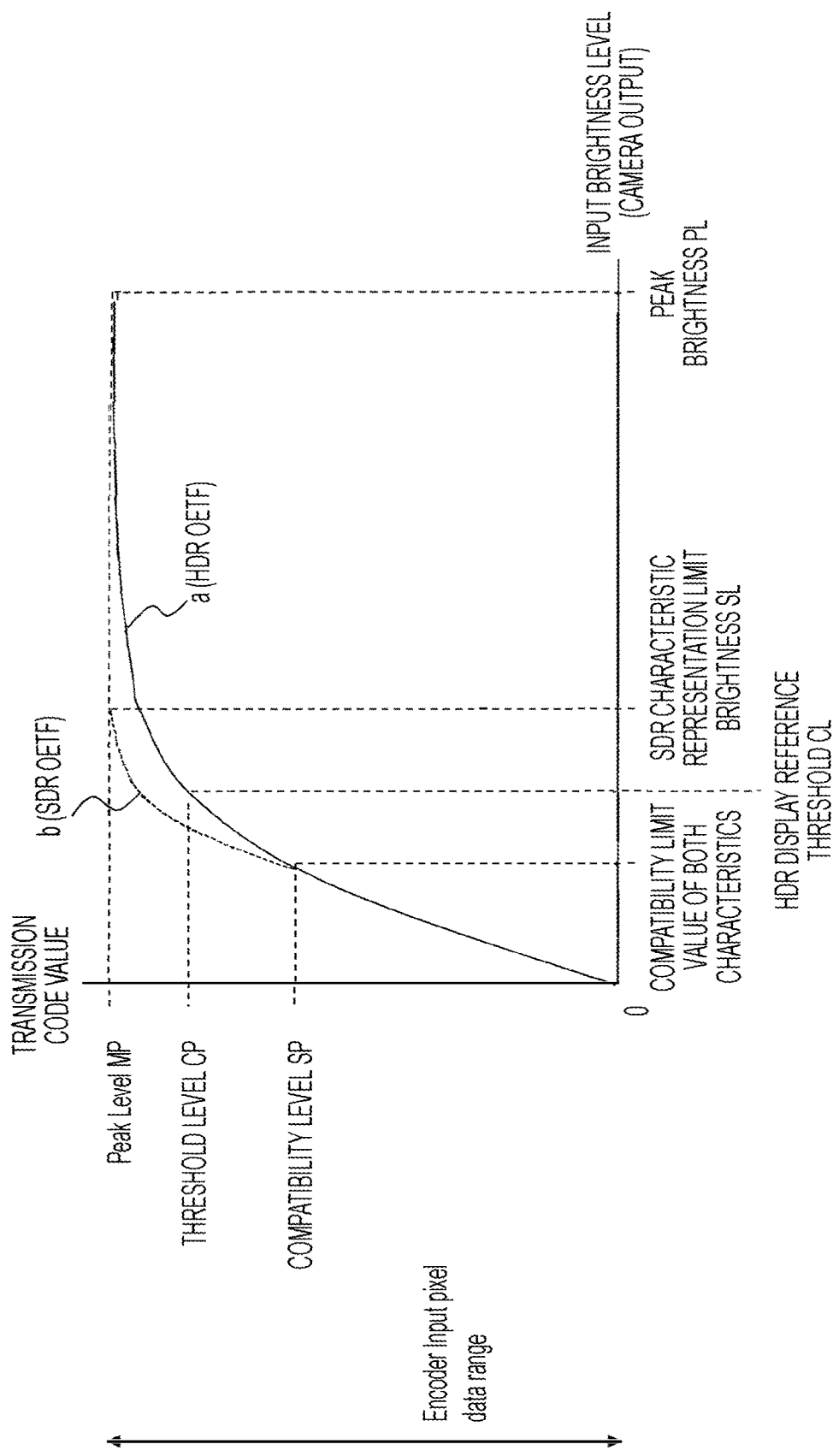
FIG. 3 is a diagram for describing an HDR opto-electronic transfer characteristic.

The HDR opto-electronic conversion unit 103 applies the HDR opto-electronic transfer characteristic to the HDR video data obtained by the HDR camera 102 to obtain transmission video data V1. A solid line a of FIG. 3 is an HDR OETF curve indicating the HDR opto-electronic transfer characteristic. In addition, a dashed line b of FIG. 3 is an SDR OETF curve indicating the SDR opto-electronic transfer characteristic. In this diagram, a horizontal axis represents an input brightness level whereas a vertical axis represents a transmission code value.

The HDR opto-electronic transfer characteristic includes a region compatible with the SDR opto-electronic transfer characteristic. That is, the curves of both characteristics match until the input brightness level becomes a compatibility limit value of both characteristics. When the input brightness level is the compatibility limit value, the transmission code value is a compatibility level SP. In the HDR opto-electronic transfer characteristic, when the input brightness level is a peak brightness PL, the transmission code value is a peak level MP.

An HDR display reference threshold CL indicates a boundary between a region in which matching is performed as brightness to be displayed on the monitor (CE monitor) on a receiver side and a CE monitor dependent region. When the input brightness level is a compatibility limit value CL, the transmission code value is a threshold level CP. Note that in the SDR opto-electronic transfer characteristic, when the input brightness level is an SDR characteristic representation limit brightness SL, the transmission code value is a peak level MP. Here, SL is 100 $cd/m^2$.

Returning to FIG. 2, the video encoder 104 performs encoding, for example, MPEG4-AVC or HEVC and the like on the transmission video data V1 to obtain encoded video data. In addition, this video encoder 104 generates a video stream including this encoded video data (video elementary stream) by a stream formatter (not illustrated) provided in a subsequent stage.

At this time, the video encoder 104 inserts the metadata information indicating the SDR opto-electronic transfer characteristic into the layer of the video stream. That is, the video encoder 104 inserts metadata information "Transfer characteristics" into a region of video usability information (VUI) of an SPS NAL unit of an access unit (AU).

In addition, the video encoder 104 inserts the metadata information indicating the HDR opto-electronic transfer characteristic and the metadata information for display control into the layer of the video stream. That is, the video encoder 104 inserts a newly defined dynamic range SEI message into an "SEIs" section of the access unit (AU).

Figure 4:
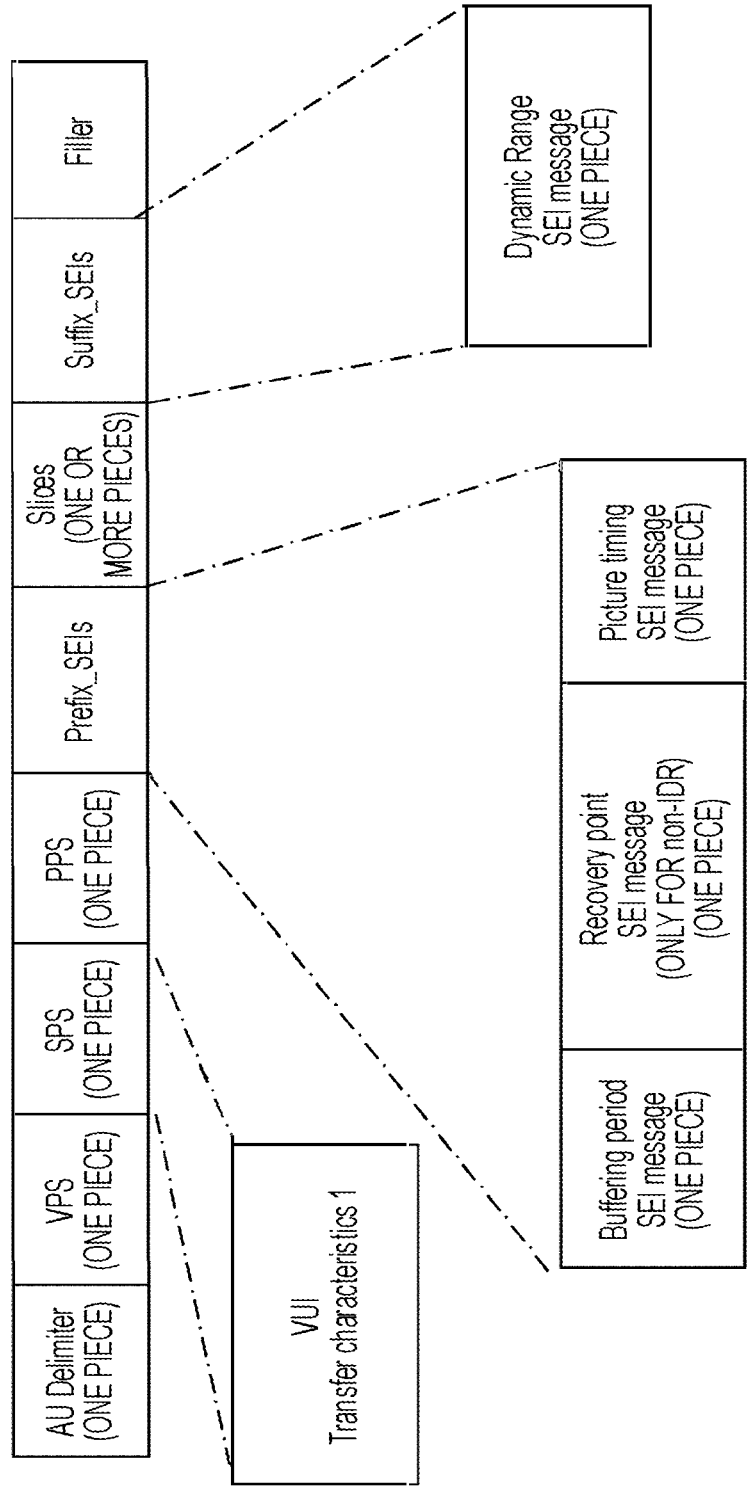
FIG. 4 is a diagram illustrating an access unit of a head of GOP when an encoding method is HEVC.
Figure 5:
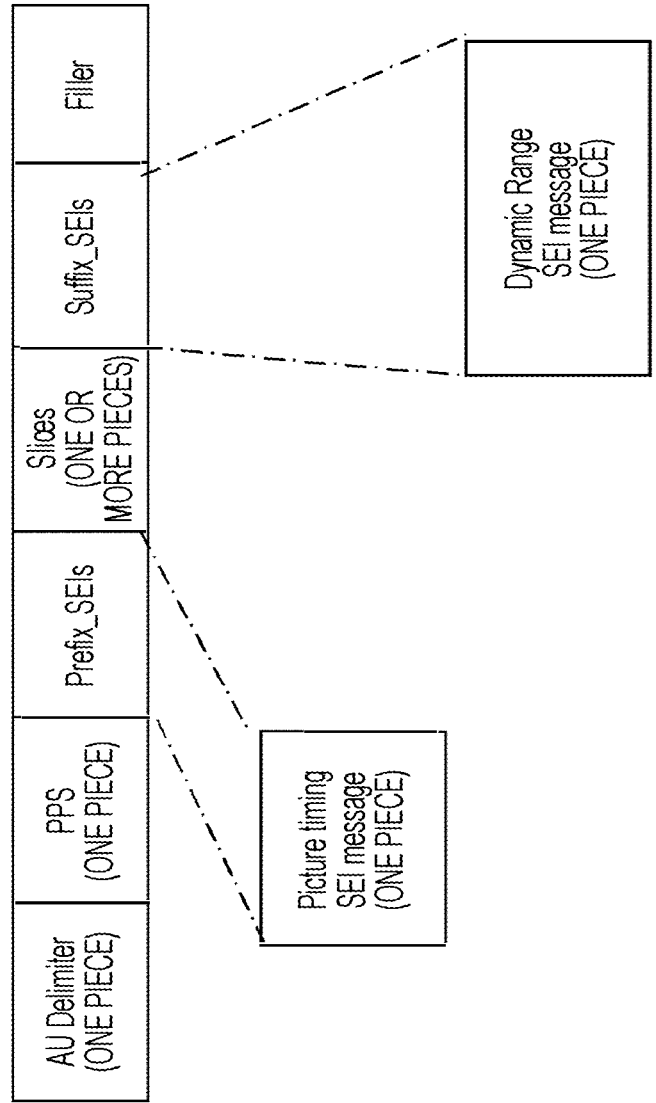
FIG. 5 is a diagram illustrating the access unit other than the head of GOP when the encoding method is HEVC.

FIG. 4 illustrates an access unit of a head of group of pictures (GOP) when an encoding method is HEVC. In addition, FIG. 5 illustrates the access unit other than the head of GOP when the encoding method is HEVC. For the HEVC encoding method, an SEI message group for decoding "Prefix_SEIs" is arranged before slices in which pixel data is encoded, and after these slices, an SEI message group for display "Suffix_SEIs" is arranged. As illustrated in FIG. 4, FIG. 5, the dynamic range SEI message is arranged as the SEI message group "Suffix_SEIs."

FIG. 6 illustrates a structural example (syntax) of the dynamic range SEI message. FIG. 7 illustrates content of major information (semantics) in the structural example. An eight-bit field of "transfer_characteristics2" designates the HDR opto-electronic transfer characteristic. An eight-bit field of "number_of_bits" represents the number of bits of encoded pixel.

A 16-bit field of "minimum_brightness_value" represents minimum level brightness ($cd/m^2$). A 16-bit field of "peak_level" represents a maximum level relative value (%). A 16-bit field of "peak_level_brightness" represents maximum level brightness ($cd/m^2$), and corresponds to the peak brightness PL in FIG. 3.

A 16-bit field of "compliant_threshold_level" represents a threshold (%) at a time of display level mapping. A 16-bit field of "compliant_threshold_level_value" represents brightness ($cd/m^2$) that serves as the threshold at a time of display level mapping, and corresponds to the HDR display reference threshold CL in FIG. 3.

Returning to FIG. 2, the system encoder 105 generates the transport stream TS including the video stream VS generated by the video encoder 104. Then, the transmission unit 106 places this transport stream TS on a broadcast wave or a network packet and transmits the transport stream TS to the reception apparatuses 200, 300.

An operation of the transmission apparatus 100 illustrated in FIG. 2 will be described briefly. The HDR video data obtained through capturing by the HDR camera 102 is supplied to the HDR opto-electronic conversion unit 103. The HDR video data obtained by the HDR camera 102 undergoes grading using the master monitor 103a. This HDR opto-electronic conversion unit 103 applies the HDR opto-electronic transfer characteristic (HDR OETF curve) to this HDR video data to perform opto-electronic conversion, and obtains the transmission video data V1. This transmission video data V1 is supplied to the video encoder 104.

The video encoder 104 performs encoding such as, for example, MPEG4-AVC or HEVC on the transmission video data V1 to obtain the encoded video data. In addition, this video encoder 104 generates the video stream including this encoded video data by the stream formatter provided in a subsequent stage.

At this time, the video encoder 104 inserts the metadata information indicating the SDR opto-electronic transfer characteristic into the layer of the video stream. That is, the video encoder 104 inserts the metadata information "Transfer characteristics 1" into the VUI region of the SPS NAL unit of the access unit (AU).

In addition, the video encoder 104 inserts the metadata information indicating the HDR opto-electronic transfer characteristic and the metadata information for display control into the layer of the video stream. That is, the video encoder 104 inserts the newly defined dynamic range SEI message into the "SEIs" section of the access unit (AU).

The video stream VS generated by the video encoder 104 is supplied to the system encoder 105. This system encoder 105 generates the MPEG-2 transport stream TS including the video stream. The transmission unit 106 places this transport stream TS on a broadcast wave or a network packet and transmits the transport stream TS to the reception apparatuses 200, 300.

Note that the foregoing description has indicated an example in which the metadata information indicating the HDR opto-electronic transfer characteristic and the metadata information for display control are inserted into the layer of the video stream. Since the dynamic range SEI message can be sent for each picture in the most frequent case, it is also possible to change the metadata information for each picture. Alternatively, the dynamic range SEI message can be sent, for example, once in a scene or in a rougher unit. Alternatively, even if the dynamic range SEI message is sent for each picture, a static operation is also possible unless a value of the metadata information changes.

The metadata information indicating the HDR opto-electronic transfer characteristic and the metadata information for display control may be inserted into the layer of the container instead of the layer of the video stream or together with the layer of the video stream. For example, the system encoder 105 inserts a newly defined video dynamic range descriptor under a program map table (PMT). This is sufficient if the static operation is sufficient.

Alternatively, if it is sufficient to know the metadata information indicating the HDR opto-electronic transfer characteristic and the metadata information for display control on a program-by-program basis, it is also conceivable to insert the video dynamic range descriptor under an event information table (EIT).

FIG. 8 illustrates a structural example (syntax) of the video dynamic range descriptor. An eight-bit field of "descriptor_tag" represents a descriptor type. Here, this represents that the descriptor is a video dynamic range descriptor. An eight-bit field of "descriptor_length" represents a length (size) of the descriptor, and represents the number of following bytes as the descriptor length. Note that although detailed description is omitted, content of this video dynamic range descriptor is identical to content of the above-described dynamic range SEI message.

Configuration of Transport Stream TS

Figure 9:
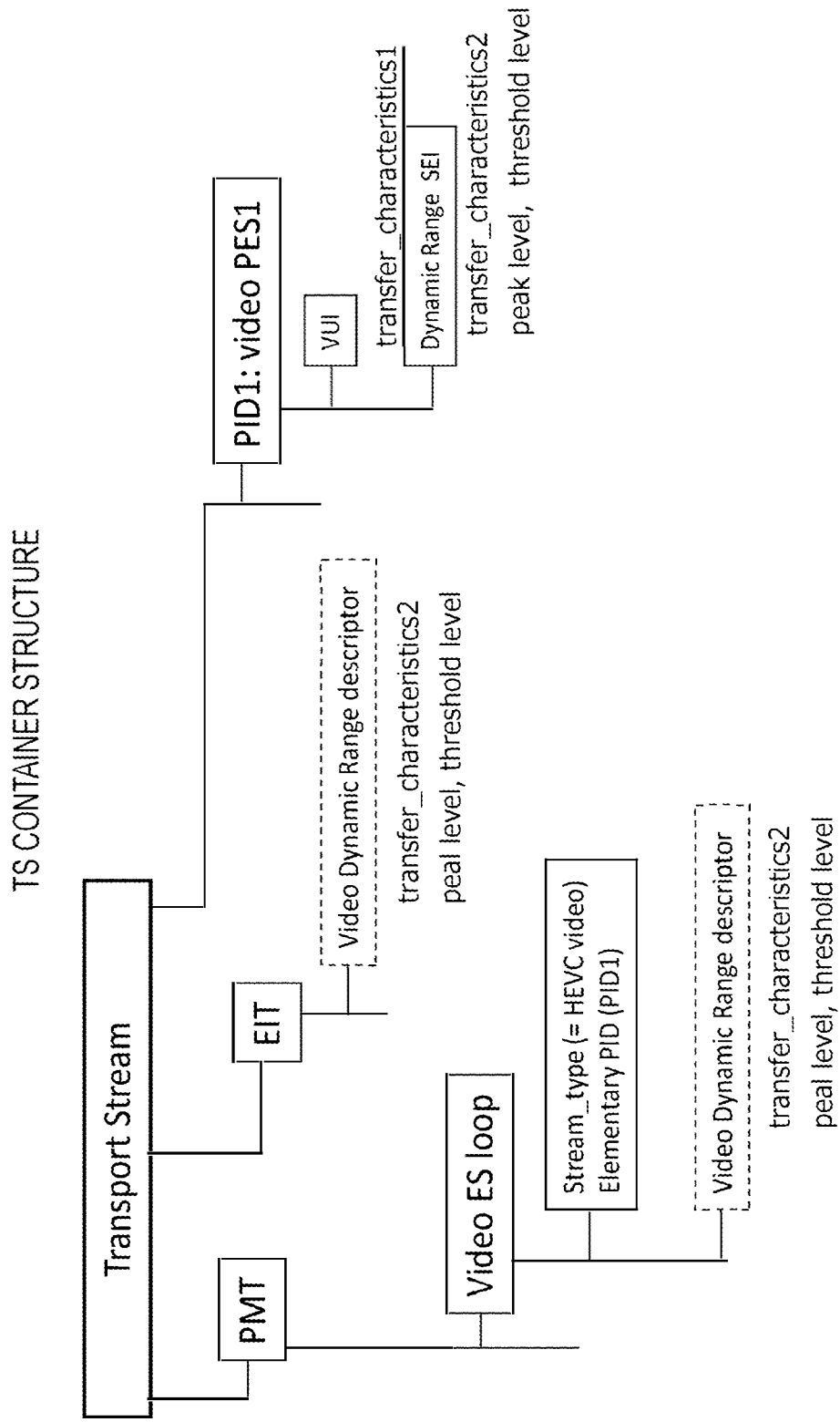
FIG. 9 is a diagram illustrating a configuration example of a transport stream TS.

FIG. 9 illustrates a configuration example of the transport stream TS. In this configuration example, a PES packet of the video stream identified by PID1 "video PES1" exists. The metadata information "Transfer characteristics 1" indicating the SDR opto-electronic transfer characteristic (gamma characteristic) is inserted into the VUI region of SPS of the access unit. In addition, the dynamic range SEI message describing the metadata information indicating the HDR opto-electronic transfer characteristic "Transfer characteristics 2" and the metadata information for display control "peak level, threshold level" are inserted into the access unit.

In addition, the transport stream TS includes the program map table (PMT) as program specific information (PSI). The PSI is information that describes to which program each elementary stream included in the transport stream belongs. In the PMT, a program loop that describes information related to the overall program exists.

In the PMT, an elementary stream loop that has information related to each elementary stream exists. In this configuration example, a video elementary stream loop corresponding to the video stream (video ES loop) exists. In the video elementary stream loop (video ES loop), information such as a stream type and a packet identifier (PID) is arranged corresponding to the video stream, and a descriptor describing information related to the video stream is also arranged.

A value of "Stream type" of this video stream is set, for example, to a value indicating an HEVC video stream, and the PID information indicates PID1 appended to the PES packet "video PES" of the video stream. As one descriptor, the video dynamic range descriptor describing the metadata information indicating the HDR opto-electronic transfer characteristic "Transfer characteristics 2" and the metadata information for display control "peak level, threshold level" may be inserted. This descriptor is inserted in place of the dynamic range SEI message or together with the dynamic range SEI message.

In addition, the transport stream TS includes the event information table (EIT) as serviced information (SI) for performing management on an event-by-event (program-by-program) basis. The video dynamic range descriptor describing the metadata information indicating the HDR opto-electronic transfer characteristic "Transfer characteristics 2" and the metadata information for display control "peak level, threshold level" may be inserted into this EIT. This descriptor is inserted in place of the dynamic range SEI message or together with the dynamic range SEI message.

Configuration Example of Conventional HDR-Incompatible Reception Apparatus

Figure 10:
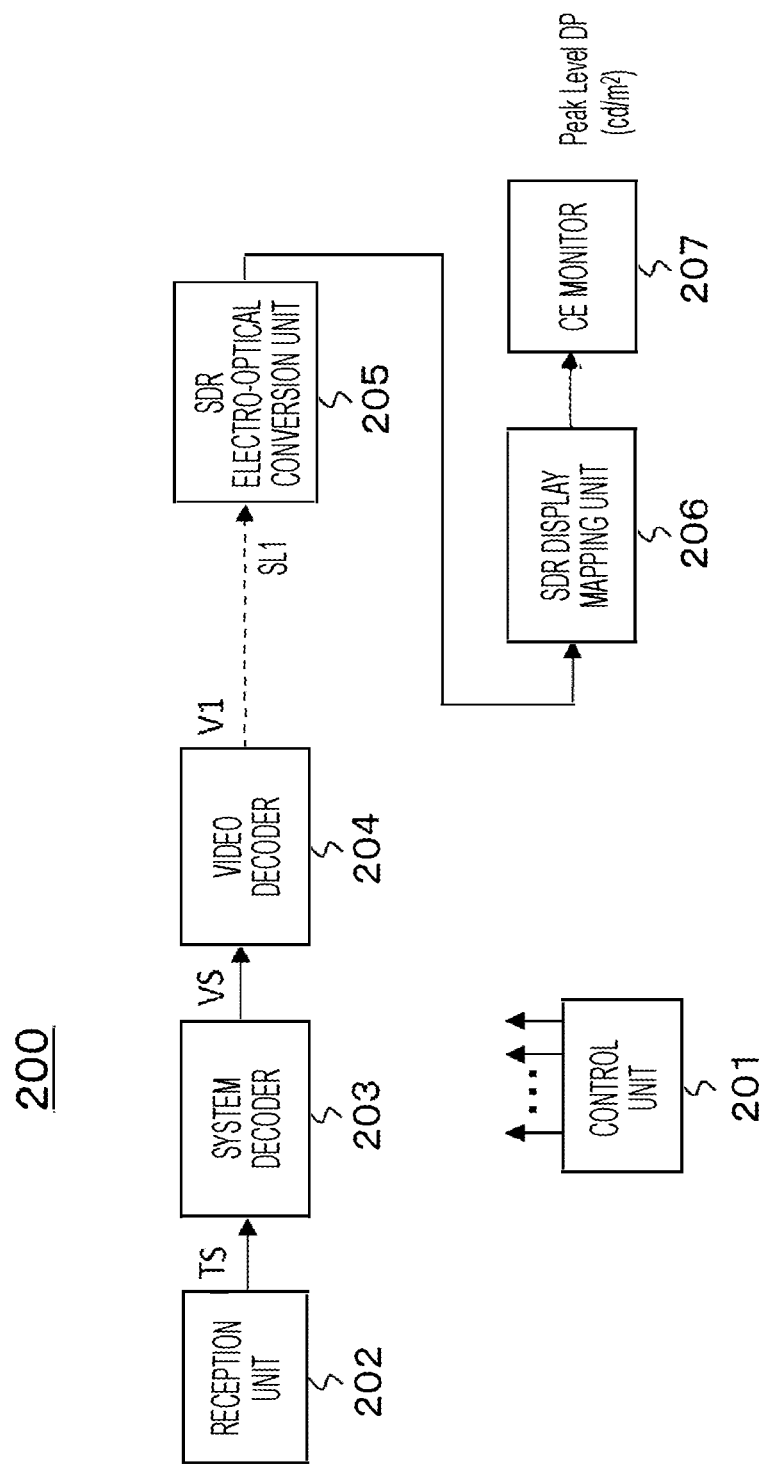
FIG. 10 is a block diagram illustrating a configuration example of a conventional HDR-incompatible reception apparatus that constitutes the transmission and reception system.

FIG. 10 illustrates a configuration example of the reception apparatus 200. As described above, this reception apparatus 200 is an HDR-incompatible reception apparatus. This reception apparatus 200 includes a control unit 201, a reception unit 202, a system decoder 203, a video decoder 204, an SDR electro-optical conversion unit 206, an SDR display mapping unit 206, and a CE monitor 207. The control unit 201 includes a central processing unit (CPU), and controls an operation of each unit of the reception apparatus 200 on the basis of a control program.

The reception unit 202 receives the transport stream TS that is placed on a broadcast wave or a network packet and sent from the transmission apparatus 100. The system decoder 203 extracts the video stream (elementary stream) VS from this transport stream TS. In addition, the system decoder 203 extracts various pieces of information inserted into the layer of the container (transport stream), and sends the information to the control unit 201. Note that when the video dynamic range descriptor is inserted into the layer of the container, since the reception apparatus 200 is not compatible with HDR, the descriptor is skipped over.

The video decoder 204 performs decoding processing on the video stream VS extracted by the system decoder 203, and then outputs the transmission video data V1. In addition, the video decoder 204 extracts a parameter set or an SEI message inserted into each access unit constituting the video stream VS, and then sends the parameter set or the SEI message to the control unit 201. Note that when the dynamic range SEI message is inserted into the layer of the video stream, since the reception apparatus 200 is not compatible with HDR, the SEI message is skipped over.

The control unit 201 recognizes the SDR opto-electronic transfer characteristic (gamma characteristic) on the basis of the metadata information indicating the SDR opto-electronic transfer characteristic "Transfer characteristics 1" in the video usability information (VUI) of the SPS, and sets the SDR electro-optical transfer characteristic with a characteristic opposite to the SDR opto-electronic transfer characteristic in the SDR electro-optical conversion unit 205. The SDR electro-optical conversion unit 205 applies the SDR electro-optical transfer characteristic to the transmission video data V1 that is output from the video decoder 204, and obtains display video data for displaying an SDR image.

Figure 12:
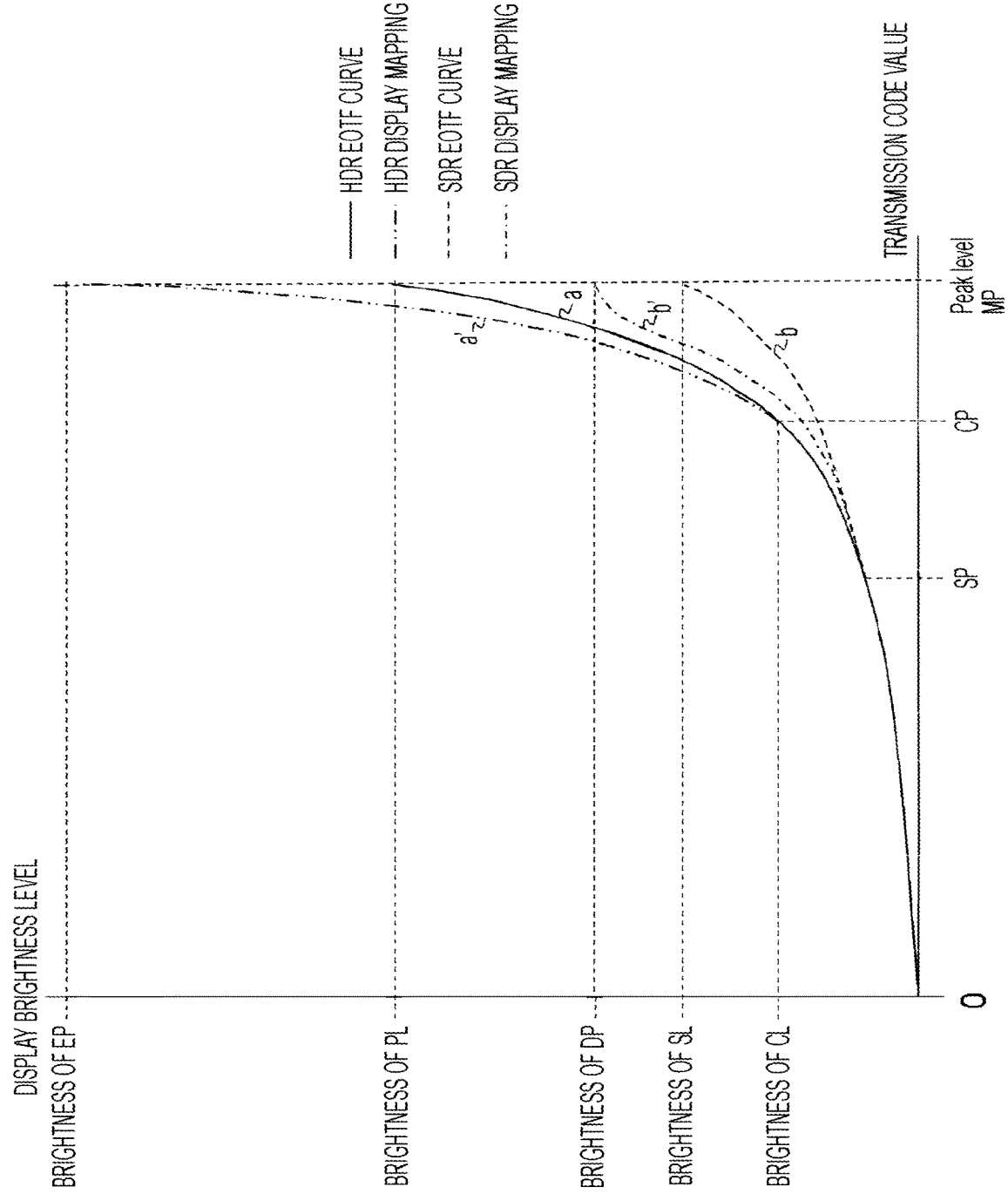

A dashed line b of FIG. 12 is an SDR EOTF curve indicating the SDR electro-optical transfer characteristic. In this diagram, a horizontal axis represents the transmission code value and corresponds to the vertical axis of aforementioned FIG. 3. In addition, in this diagram, a vertical axis represents a display brightness level (output brightness level), and corresponds to the horizontal axis of aforementioned FIG. 3. In the SDR electro-optical transfer characteristic, when the transmission code value is the peak level MP, the display brightness level is SL. This SL is the SDR characteristic representation limit brightness as described above, and is 100 cd/m$^2$.

The SDR display mapping unit 206 performs display brightness adjustment on the display video data obtained by the SDR electro-optical conversion unit 205. That is, when maximum brightness display capability of the CE monitor 207 is DP, which is higher than SL, the SDR display mapping unit 206 performs display mapping processing, that is, brightness conversion processing so as to cause the display maximum brightness level to be DF. An alternate long and short dash line b' of FIG. 12 indicates one example of the brightness conversion processing in this case.

An operation of the reception apparatus 200 illustrated in FIG. 10 will be described briefly. The reception unit 202 receives the transport stream TS that is placed on a broadcast wave or a network packet and sent from the transmission apparatus 100. This transport stream TS is supplied to the system decoder 203. The system decoder 203 extracts the video stream VS from this transport stream TS.

In addition, the system decoder 203 extracts various pieces of information inserted into the layer of the container and sends the information to the control unit 201. Note that when the video dynamic range descriptor is inserted into the layer of the container, since the reception apparatus 200 is not compatible with HDR, the descriptor is skipped over.

The video stream VS extracted by the system decoder 203 is supplied to the video decoder 204. The video decoder 204 performs decoding processing on the video stream VS extracted by the system decoder 203 to obtain the transmission video data V1.

In addition, the video decoder 204 extracts the parameter set or the SEI message inserted into each access unit constituting the video stream VS, and then sends the parameter set or the SEI message to the control unit 201. Note that when the dynamic range SEI message is inserted into the layer of the video stream, since the reception apparatus 200 is not compatible with HDR, the SEI message is skipped over.

The control unit 201 recognizes the SDR opto-electronic transfer characteristic (gamma characteristic) on the basis of the metadata information indicating the SDR opto-electronic transfer characteristic "Transfer characteristics 1" in the video usability information (VUI) of the SPS, and sets the SDR electro-optical transfer characteristic with a characteristic opposite to the SDR opto-electronic transfer characteristic in the SDR electro-optical conversion unit 205.

The transmission video data V1 obtained by the video decoder 203 is supplied to the SDR electro-optical conversion unit 205. The SDR electro-optical conversion unit 205 applies the SDR electro-optical transfer characteristic to the transmission video data V1 that is output from the video decoder 204, and obtains display video data for displaying an SDR image.

The display video data obtained by the SDR electro-optical conversion unit 205 is supplied to the SDR display mapping unit 206. The SDR display mapping unit 206 performs display brightness adjustment on the display video data. That is, when the maximum brightness display capability of the CE monitor 207 is DP, which is higher than SL, the SDR display mapping unit 206 performs display mapping processing, that is, brightness conversion processing so as to cause the display maximum brightness level to be DP (refer to the alternate long and short dash line b' of FIG. 12).

Output video data of the display mapping unit 206 is supplied to the CE monitor 207. This CE monitor 207 displays the SDR image that undergoes the display brightness adjustment.

Configuration Example of HDR-Compatible Reception Apparatus

Figure 11:
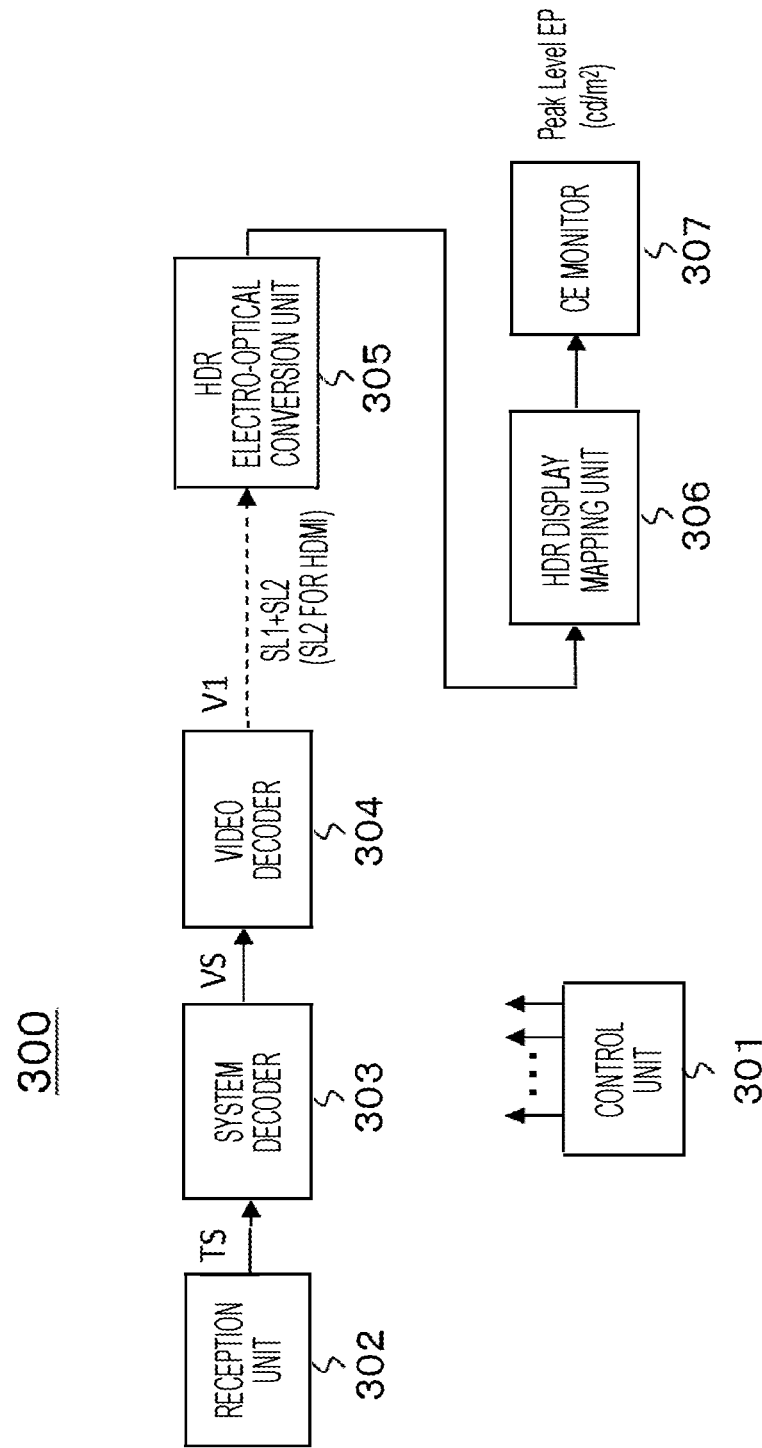
FIG. 11 is a block diagram illustrating a configuration example of an HDR-compatible reception apparatus that constitutes the transmission and reception system.

FIG. 11 illustrates a configuration example of the reception apparatus 300. As described above, this reception apparatus 300 is an HDR-compatible reception apparatus. This reception apparatus 300 includes a control unit 301, a reception unit 302, a system decoder 303, a video decoder 304, an HDR electro-optical conversion unit 305, an HDR display mapping unit 306, and a CE monitor 307. The control unit 301 includes a central processing unit (CPU), and controls an operation of each unit of the reception apparatus 300 on the basis of a control program.

The reception unit 302 receives the transport stream TS that is placed on a broadcast wave or a network packet and sent from the transmission apparatus 100. The system decoder 303 extracts the video stream (elementary stream) VS from this transport stream TS. In addition, the system decoder 303 extracts various pieces of information inserted into the layer of the container (transport stream), and sends the information to the control unit 301. When the video dynamic range descriptor is inserted into the layer of the container, since the reception apparatus 300 is compatible with HDR, the extracted information also includes information on the descriptor.

The video decoder 304 performs decoding processing on the video stream VS extracted by the system decoder 303, and then outputs the transmission video data V1. In addition, the video decoder 304 extracts the parameter set or the SEI message inserted into each access unit constituting the video stream VS, and then sends the parameter set or the SEI message to the control unit 301. Note that when the dynamic range SEI message is inserted into the layer of the video stream, since the reception apparatus 300 is compatible with HDR, the SEI message is also extracted.

The control unit 301 recognizes the HDR opto-electronic transfer characteristic (new gamma characteristic) on the basis of the metadata information indicating the HDR opto-electronic transfer characteristic "Transfer characteristics 2" in the dynamic range SEI message or video dynamic range descriptor, and sets the HDR electro-optical transfer characteristic with a characteristic opposite to the HDR opto-electronic transfer characteristic in the HDR electro-optical conversion unit 305. The HDR electro-optical conversion unit 305 applies the HDR electro-optical transfer characteristic to the transmission video data V1 that is output from the video decoder 304, and obtains display video data for displaying an HDR image.

A solid line a of FIG. 12 is an HDR EOTF curve indicating the HDR electro-optical transfer characteristic. In the HDR electro-optical transfer characteristic, when the transmission code value is the peak level MP, the display brightness level is PL. In addition, when the transmission code value is the threshold level CP, the output brightness level is the HDR display reference threshold CL. As described above, this threshold CL indicates the boundary between the region in which matching is performed as brightness to be displayed on the monitor (CE monitor) on a receiver side and the CE monitor dependent region.

Brightness information of PL and CL is included as the metadata information for display control in the dynamic range SEI message inserted into the layer of the video stream and the video dynamic range descriptor inserted in the layer of the container (refer to FIG. 6 to FIG. 8).

The HDR display mapping unit 306 performs display brightness adjustment on the display video data obtained by the HDR electro-optical conversion unit 305 on the basis of the metadata information for display control. That is, when the maximum brightness display capability of the CE monitor 307 is EP, which is higher than PL, the HDR display mapping unit 306 can also perform display mapping processing, that is, perform brightness conversion processing on the level exceeding the brightness CL out of the output brightness level of the HDR electro-optical conversion unit 305 so as to cause the display maximum brightness level to be EP, as one method of display functions. A two-dot chain line a' of FIG. 12 indicates one example of the brightness conversion processing in this case.

An operation of the reception apparatus 300 illustrated in FIG. 11 will be described briefly. The reception unit 302 receives the transport stream TS that is placed on a broadcast wave or a network packet and sent from the transmission apparatus 100. This transport stream TS is supplied to the system decoder 303. The system decoder 303 extracts the video stream VS from this transport stream TS.

In addition, the system decoder 303 extracts various pieces of information inserted into the layer of the container and sends the information to the control unit 301. Note that when the video dynamic range descriptor is inserted into the layer of the container, since the reception apparatus 300 is compatible with HDR, the extracted information also includes the information on the descriptor.

The video stream VS extracted by the system decoder 303 is supplied to the video decoder 304. The video decoder 304 performs decoding processing on the video stream VS extracted by the system decoder 303 to obtain the transmission video data V1.

In addition, the video decoder 304 extracts the parameter set or SEI message inserted into each access unit constituting the video stream VS, and sends the parameter set or SEI message to the control unit 301. Note that when the dynamic range SEI message is inserted into the layer of the video stream, since the reception apparatus 300 is compatible with HDR, the SEI message is also extracted.

The control unit 301 recognizes the HDR opto-electronic transfer characteristic (new gamma characteristic) on the basis of the metadata information indicating the HDR opto-electronic transfer characteristic "Transfer characteristics 2" in the dynamic range SEI message or video dynamic range descriptor, and sets the HDR electro-optical transfer characteristic with a characteristic opposite to the HDR opto-electronic transfer characteristic in the HDR electro-optical conversion unit 305. The HDR electro-optical conversion unit 305 applies the HDR electro-optical transfer characteristic to the transmission video data V1 that is output from the video decoder 304, and then obtains display video data for displaying an HDR image.

The display video data obtained by the HDR electro-optical conversion unit 305 is supplied to the HDR display mapping unit 306. The HDR display mapping unit 306 performs display brightness adjustment on the display video data on the basis of the metadata information for display control. That is, when the maximum brightness display capability of the CE monitor 307 is EP, which is higher than PL, the HDR display mapping unit 306 performs display mapping processing, that is, perform brightness conversion processing on the level exceeding the brightness CL out of the output brightness level of the HDR electro-optical conversion unit 305 so as to cause the display maximum brightness level to be EP (refer to the two-dot chain line a' of FIG. 12).

Output video data of the display mapping unit 306 is supplied to the CE monitor 307. This CE monitor 307 displays the HDR image that undergoes display brightness adjustment.

As described above, in the transmission and reception system 10 illustrated in FIG. 1, the metadata information indicating the SDR opto-electronic transfer characteristic (gamma characteristic) is inserted into the layer of the video stream, and the metadata information indicating the HDR opto-electronic transfer characteristic (new gamma characteristic) is inserted into at least one of the layer of the video stream and the layer of the container. Therefore, both the conventional receiver and the HDR-compatible receiver can well perform electro-optical conversion processing on the transmission video data V1 obtained by using the HDR opto-electronic transfer characteristic.

That is, the conventional receiver (reception apparatus 200) can determine that the opto-electronic transfer characteristic is similar to conventional one on the basis of the metadata information indicating the SDR opto-electronic transfer characteristic. In addition, the HDR-compatible receiver (reception apparatus 300) can determine that the opto-electronic transfer characteristic is the HDR opto-electronic transfer characteristic on the basis of the metadata information indicating the HDR opto-electronic transfer characteristic. Therefore, both the conventional electro-optical conversion processing on the transmission video data V1 obtained by using the HDR opto-electronic transfer characteristic.

In addition, in the transmission and reception system 10 illustrated in FIG. 1, the metadata information for display control is inserted together with the metadata information indicating the HDR opto-electronic transfer characteristic. Therefore, the HDR-compatible receiver can properly perform the display brightness control by using this metadata information for display control. In this case, the metadata information for display control includes region information indicating a region in which brightness conversion is permitted, and for example, the brightness conversion according to the display brightness capability of the CE monitor 307 is performed only in the region in which the brightness conversion is permitted, which makes it possible to well reproduce brightness atmosphere intended by a production side.

2. Variations

Note that the above-described embodiment has described an example in which, in the reception apparatuses 200, 300, the electro-optical conversion units 205, 305 perform the electro-optical conversion processing and the display mapping units 206, 306 perform the brightness conversion processing according to the maximum brightness display capability of the CE monitors 207, 307. However, it is possible to cause only the electro-optical conversion units 205, 305 to perform the electro-optical conversion processing and the brightness conversion processing simultaneously by reflecting the brightness transfer characteristic on the electro-optical transfer characteristic (EOTF).

Figure 13:
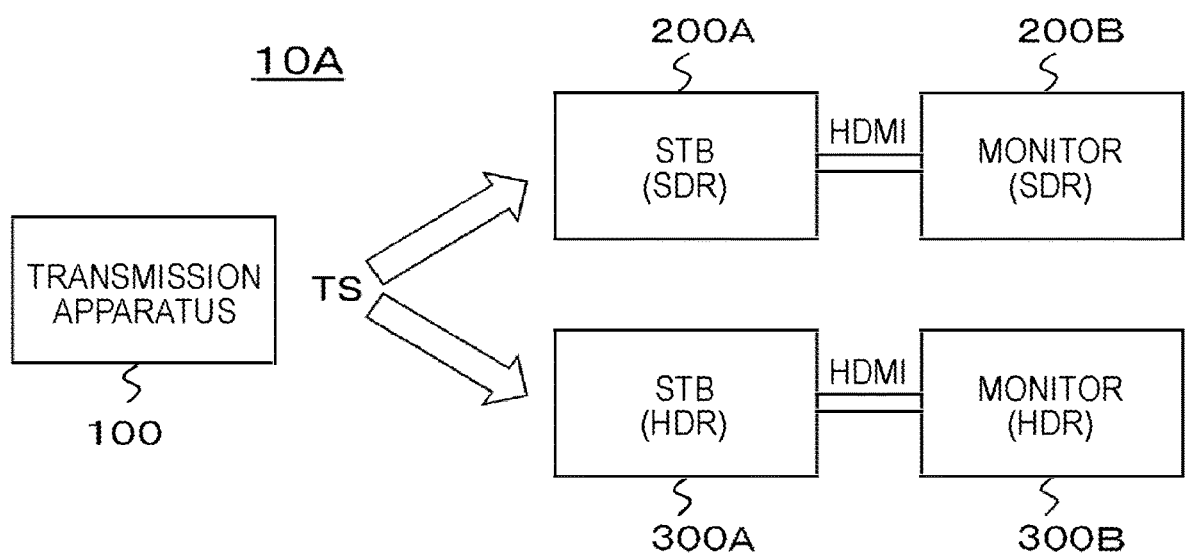
FIG. 13 is a block diagram illustrating another configuration example of the transmission and reception system.

In addition, the above-described embodiment has described the transmission and reception system 10 including the transmission apparatus 100 and the reception apparatuses 200, 300; however, the configuration of the transmission and reception system to which the present technology is applicable is not limited to this configuration. For example, as in the transmission and reception system 10A illustrated in FIG. 13, a section of the reception apparatuses 200, 300 may include, for example, set top boxes (STBs) 200A, 300A and monitors 200B, 300B connected by a digital interface such as (high-definition multimedia interface (HDMI). Note that "HDMI" is a registered trademark.

In this case, the video decoders 204, 304 and upstream sections are included in the set top boxes 200A, 300A, whereas the electro-optical conversion units 205, 305 and downstream sections are included in the monitors 200B, 300B. The HDR-incompatible set top box 200A sends the metadata information indicating the SDR opto-electronic transfer characteristic (gamma characteristic) to the monitor 200B, for example, by using a packet of "Vender Specific Info Frame." In addition, the HDR-compatible set top box 300A sends the metadata information indicating the HDR opto-electronic transfer characteristic (gamma characteristic) and the metadata information for display control to the monitor 300B, for example, by using the packet of "Vender Specific Info Frame."

FIG. 14 illustrates a structural example of seventh and subsequent bytes of the packet of "Vender Specific InfoFrame" to be sent from the set top box 200A to the monitor 200B. In addition, FIG. 15 illustrates a structural example of seventh and subsequent bytes of the packet of "Vender Specific InfoFrame" to be sent from the set top box 300A to the monitor 300B. In addition, FIG. 16 illustrates content of major information in each structural example.

First, the structural example of FIG. 14 will be described. In the seventh bit to the fifth bit of the seventh byte, three-bit information of "Display_control_type" is arranged. This three-bit information represents a kind of display type. A numerical value "001" represents SD display control, whereas a numerical value "010" represents HDR display control. Here, "001" is set.

In the fourth bit to the 0th bit of the seventh byte, five-bit information of "Display_control_metadata_length" is arranged. This five-bit information represents a size of "Display_control_metadata" to be subsequently arranged in the number of bytes. Here, "2" is set.

In the eighth byte, eight-bit information of "Transfer characteristics" is arranged. This eight-bit information represents the opto-electronic transfer characteristic. With this information, the electro-optical transfer characteristic for display is detected. "0x01" represents the SDR opto-electronic transfer characteristic (gamma characteristic), whereas "0x10" represents the HDR opto-electronic transfer characteristic (new gamma characteristic). Here, "0x01" is set. In the (8+1)th byte, eight-bit information of "Number of bits" is arranged. This eight-bit information represents the number of bits of encoded pixel.

Next, the configuration example of FIG. 15 will be described. In the seventh bit to the fifth bit of the seventh byte, three-bit information of "Display_control_type" is arranged. This three-bit information represents a kind of display type. A numerical value "001" represents SD display control, whereas a numerical value "010" represents HDR display control. Here, "010" is set.

In the fourth bit to the 0th bit of the seventh byte, five-bit information of "Display_control_metadata_length" is arranged. This five-bit information represents a size of "Display_control_metadata" to be subsequently arranged in the number of bytes. Here, "12" is set.

In the eighth byte, eight-bit information of "Transfer characteristics" is arranged. This eight-bit information represents the opto-electronic transfer characteristic. With this information, the electro-optical transfer characteristic for display is detected. "0x01" represents the SDR opto-electronic transfer characteristic (gamma characteristic), whereas "0x10" represents the HDR opto-electronic transfer characteristic (new gamma characteristic). Here, "0x10" is set. In the (8+1)th byte, eight-bit information of "Number of bits" is arranged. This eight-bit information represents the number of bits of encoded pixel.

In the (8+2)th byte to the (8+3)th byte, 16-bit information of "Minimum brightness value" is arranged. This 16-bit information represents minimum level brightness (cd/m$^2$). In the (8+4)th byte to the (8+5)th byte, 16-bit information of "Peak Level" is arranged. This 16-bit information represents a maximum level relative value (%).

In the (8+6)th byte to the (8+7)th byte, 16-bit information of "Peak Level Brightness" is arranged. This 16-bit information represents maximum level brightness (cd/m$^2$). In the (8+8)th byte to the (8+9)th byte, 16-bit information of "Compliant_threshold_level" is arranged. This 16-bit information represents a threshold (%) at a time of display level mapping. In the (8+10)th byte to the (8+11)th byte, 16-bit information of "Compliant_threshold_level_value" is arranged. This 16-bit information represents brightness (cd/m$^2$) which is a threshold at a time of display level mapping.

In addition, the above-described embodiment has described an example in which the container is a transport stream (MPEG-2 TS). However, in the present technology, the transport is not limited to TS, and even for other packets, for example, ISOBMFF and MMT, video layers can be implemented by the same method. Therefore, the present technology is also similarly applicable to a system with a configuration of distribution to a reception terminal using a network such as the Internet. In the distribution over the Internet, distribution is often carried out on a container of MP4 or other formats. That is, as the container, containers of various formats are applicable, such as the transport stream employed in the digital broadcasting standard (MPEG-2 TS) and MP4 used for Internet distribution.

In addition, the present technology can also have the following configurations.

(1) A transmission apparatus including:
an opto-electronic conversion unit configured to perform high dynamic range opto-electronic conversion on high dynamic range video data to obtain transmission video data;
an encoding unit configured to perform encoding processing on the transmission video data to obtain video stream;
a transmission unit configured to transmit a container of a predetermined format including the video stream; and
an information insertion unit configured to insert metadata information indicating a standard dynamic range opto-electronic transfer characteristic into a layer of the video stream, and to insert metadata information indicating the high dynamic range opto-electronic transfer characteristic into at least one of the layer of the video stream and a layer of the container.

(2) The transmission apparatus according to (1), wherein the information insertion unit inserts metadata information for display control together with the metadata information indicating the high dynamic range opto-electronic transfer characteristic.

(3) The transmission apparatus according to (2), wherein the metadata information for display control includes peak brightness information.

(4) The transmission apparatus according to (2) or (3), wherein the metadata information for display control includes region information indicating a region in which brightness conversion is permitted.

(5) The transmission apparatus according to any of (1) to (4), wherein when inserting the metadata information indicating the high dynamic range opto-electronic transfer characteristic into the layer of the video stream, the information insertion unit inserts the metadata information indicating the standard dynamic range opto-electronic transfer characteristic into a first region in the video stream, and inserts the metadata information indicating the high dynamic range opto-electronic transfer characteristic into a second region different from the first region in the video stream.

(6) The transmission apparatus according to (5), wherein the first region is a region of an SPS NAL unit, and the second region is a region of an SEI HAL unit.

(7) The transmission apparatus according to any of (1) to (6), wherein
the container is a transport stream, and
when inserting the metadata information indicating the high dynamic range opto-electronic transfer characteristic into the layer of the container, the information insertion unit inserts the metadata information under a program map table.

(8) The transmission apparatus according to any of (1) to (6), wherein
the container is a transport stream, and
when inserting the metadata information indicating the high dynamic range opto-electronic transfer characteristic into the layer of the container, the information insertion unit inserts the metadata information under an event information table.
(9) A transmission method including:
an opto-electronic conversion step of performing high dynamic range opto-electronic conversion on high dynamic range video data to obtain transmission video data;
an encoding step of performing encoding processing on the transmission video data to obtain a video stream;
a transmission step of transmitting, by a transmission unit, a container of a predetermined format including the video stream; and
an information insertion step of inserting metadata information indicating a standard dynamic range opto-electronic transfer characteristic into a layer of the video stream, and of inserting metadata information indicating the high dynamic range opto-electronic transfer characteristic into at least one of the layer of the video stream and a layer of the container.
(10) A reception apparatus including:
a reception unit configured to receive a container including a video stream obtained through encoding of transmission video data;
a decoding unit configured to perform decoding processing on the video stream to obtain the transmission video data; and
an electro-optical conversion unit configured to perform electro-optical conversion on the transmission video data to obtain video data for display,
wherein when metadata information indicating a standard dynamic range opto-electronic transfer characteristic is inserted into a layer of the video stream and metadata information indicating the high dynamic range opto-electronic transfer characteristic is inserted into at least one of the layer of the video stream and a layer of the container, on the basis of the metadata information indicating the high dynamic range opto-electronic transfer characteristic, the electro-optical conversion unit performs high dynamic range electro-optical conversion with a characteristic opposite to the high dynamic range opto-electronic transfer characteristic on the transmission video data to obtain the video data for display.
(11) The reception apparatus according to (10), further including a brightness adjustment unit configured to perform display brightness adjustment on the video data for display, wherein when metadata information for display control is inserted together with the metadata information indicating the high dynamic range opto-electronic transfer characteristic, the brightness adjustment unit performs the display brightness adjustment on the video data for display on the basis of the metadata information for display control.
(12) The reception apparatus according to (11), wherein
the metadata information for display control includes region information indicating a region in which brightness conversion is permitted, and
the brightness adjustment unit performs the display brightness adjustment in the region in which the brightness conversion is permitted.
(13) A reception method including:
a reception step of receiving, by a reception unit, a container including a video stream obtained through encoding of transmission video data;
a decoding step of performing decoding processing on the video stream to obtain the transmission video data; and
an electro-optical conversion step of performing electro-optical conversion on the transmission video data to obtain video data for display,
wherein when metadata information indicating a standard dynamic range opto-electronic transfer characteristic is inserted into a layer of the video stream and metadata information indicating the high dynamic range opto-electronic transfer characteristic is inserted into at least one of the layer of the video stream and a layer of the container, on the basis of the metadata information indicating the high dynamic range opto-electronic transfer characteristic, the electro-optical conversion step includes performing high dynamic range electro-optical conversion with a characteristic opposite to the high dynamic range opto-electronic transfer characteristic on the transmission video data to obtain the video data for display.

Major features of the present technology is that both of the conventional receiver and the HDR-compatible receiver can well perform the electro-optical conversion processing on the transmission video data obtained by using the HDR opto-electronic transfer characteristic, by inserting the metadata information indicating the SDR opto-electronic transfer characteristic (gamma characteristic) into the layer of the video stream, and by inserting the metadata information indicating the HDR opto-electronic transfer characteristic (new gamma characteristic) into at least one of the layer of the video stream and the layer of the container (refer to FIG. 9).

REFERENCE SIGNS LIST 10, 10A Transmission and reception system
100 Transmission apparatus
101 Control unit
102 HDR camera
103 HDR opto-electronic conversion unit
103a Master monitor
104 Video encoder
105 System encoder
106 Transmission unit
200, 300 Reception apparatus
200A, 300A Set top box
200B, 300B Monitor
201/301 Control unit
202, 302 Reception unit
203, 303 System decoder
204, 304 Video decoder
205 SDR electro-optical conversion unit
206 SDR display mapping unit
207, 307 CS monitor
305 HDR electro-optical conversion unit
306 HDR display mapping unit.

The invention claimed is:
1. A transmission apparatus, comprising:
circuitry configured to
perform a high dynamic range opto-electronic conversion on high dynamic range (HDR) video data to obtain transmission video data;
perform encoding processing on the transmission video data to obtain a video stream;
transmit a container including the video stream; and
insert first metadata information indicating a standard dynamic range (SDR) opto-electronic transfer curve into the video stream, insert second metadata information indicating a HDR opto-electronic transfer curve into the container or the video stream, and insert third metadata information for display control into the video stream, the SDR opto-electronic transfer curve and the HDR opto-electronic transfer curve each relating a brightness level to a code value.

2. The transmission apparatus according to claim 1, wherein the third metadata information for display control includes peak brightness information.

3. The transmission apparatus according to claim 1, wherein the circuitry is further configured to insert the first metadata information into a region of a sequence parameter set network abstract layer (NAL) unit of the video stream, and insert the third metadata information for display control into a region of a supplemental enhancement information NAL unit of the video stream.

4. The transmission apparatus according to claim 1, wherein the circuitry is further configured to insert the second metadata information into a region of a supplemental enhancement information network abstract layer unit of the video stream.

5. The transmission apparatus according to claim 1, wherein the circuitry is further configured to insert the second metadata information into program information or event information of the container.

6. A reception apparatus, comprising:
receiver circuitry configured to receive a container including a video stream, the video stream being obtained through encoding process performed on transmission video data, wherein
first metadata information indicating a standard dynamic range (SDR) opto-electronic transfer curve is inserted into the video stream, second metadata information indicating a high dynamic range (HDR) opto-electronic transfer curve is inserted into the container or the video stream, and third metadata information for display control is inserted into the video stream, the SDR opto-electronic transfer curve and the HDR opto-electronic transfer curve each relating a brightness level to a code value; and
processing circuitry is configured to
perform decoding processing on the video stream to obtain the transmission video data,
perform a HDR electro-optical conversion, with a characteristic opposite to the HDR opto-electronic transfer curve, on the transmission video data to obtain video data for display, based on the second metadata information indicating the HDR opto-electronic transfer curve, and
perform a display brightness adjustment on the video data for display based on the third metadata information for display control.

7. The reception apparatus according to claim 6, wherein the third metadata information for display control includes peak brightness information.

8. The reception apparatus according to claim 6, wherein the first metadata information is inserted into a region of a sequence parameter set network abstract layer (NAL) unit of the video stream, and the third metadata information for display control is inserted into a region of a supplemental enhancement information NAL unit of the video stream.

9. The reception apparatus according to claim 6, wherein the second metadata information is inserted into a region of a supplemental enhancement information network abstract layer unit of the video stream.

10. The reception apparatus according to claim 6, wherein the second metadata information is inserted into program information or service information of the container.

11. A reception method, comprising:
receiving, by receiver circuitry, a container including a video stream, the video stream being obtained through encoding process performed on transmission video data, wherein
first metadata information indicating a standard dynamic range (SDR) opto-electronic transfer curve is inserted into the video stream, second metadata information indicating a high dynamic range (HDR) opto-electronic transfer curve is inserted into the container or the video stream, and third metadata information for display control is inserted into the video stream, the SDR opto-electronic transfer curve and the HDR opto-electronic transfer curve each relating a brightness level to a code value;
performing, by processing circuitry, decoding processing on the video stream to obtain the transmission video data;
performing, by the processing circuitry, a HDR electro-optical conversion, with a characteristic opposite to the HDR opto-electronic transfer curve on the transmission video data, to obtain video data for display based on the second metadata information indicating the HDR opto-electronic transfer curve; and
performing, by the processing circuitry, a display brightness adjustment on the video data for display based on the third metadata information for display control.

12. The reception method according to claim 11, wherein the third metadata information for display control includes peak brightness information.

13. The reception method according to claim 11, wherein the first metadata information is inserted into a region of a sequence parameter set network abstract layer (NAL) unit of the video stream, and the third metadata information for display control is inserted into a region of a supplemental enhancement information NAL unit of the video stream.

14. The reception method according to claim 11, wherein the second metadata information is inserted into a region of a supplemental enhancement information network abstract layer unit of the video stream.

15. The reception method according to claim 11, wherein the second metadata information is inserted into program information or service information of the container.

16. The transmission apparatus of claim 1, wherein the circuitry is configured to insert the second metadata information indicating the HDR opto-electronic transfer curve, which indicates a relationship between an input brightness level and a code value for the HDR video data.

* * * * *